(12) United States Patent
Chiou

(10) Patent No.: US 6,682,406 B2
(45) Date of Patent: Jan. 27, 2004

(54) ABRASIVE CLEANING TOOL FOR REMOVING CONTAMINATION

(75) Inventor: Frank Chiou, Taiwan (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 11 days.

(21) Appl. No.: 09/998,025

(22) Filed: Nov. 30, 2001

(65) Prior Publication Data
US 2003/0104771 A1 Jun. 5, 2003

(51) Int. Cl.⁷ .................... B24B 1/00; B24B 21/18
(52) U.S. Cl. .................................. 451/56; 451/444
(58) Field of Search ............... 451/99, 56, 59, 451/289, 388, 443, 444, 456

(56) References Cited

U.S. PATENT DOCUMENTS 5,603,775 A * 2/1997 Sjoberg ................ 134/21
5,885,137 A * 3/1999 Ploessl ................. 451/56
5,916,010 A * 6/1999 Varian et al. .......... 451/38
6,099,393 A * 8/2000 Katagiri et al. ....... 451/56
6,443,816 B2 * 9/2002 Inoue et al. ........... 451/56

* cited by examiner

Primary Examiner—Dung Van Nguyen
(74) Attorney, Agent, or Firm—Tung & Associates

(57) ABSTRACT

A cleaning tool for simultaneously abrading a contaminated surface and collecting contaminating particles and a method for using the same is provided the cleaning tool including an abrasive member including an abrasive surface said abrasive surface including a recessed area forming a collection space; said collection space in gaseous communication with at least one gaseous pathway; said at least one gaseous pathway passing longitudinally through a rotatably adjustable elongated handle rotatably attached to the abrasive member for adjustably varying an orientation angle defined by the elongated handle and the abrasive surface; whereby a suction force may be applied along the at least one gaseous pathway to collect particles loosened by the abrasive surface through the collection space.

16 Claims, 1 Drawing Sheet

ABRASIVE CLEANING TOOL FOR REMOVING CONTAMINATION

FIELD OF THE INVENTION

This invention generally relates to cleaning apparatus and methods applied to the semiconductor processing arts and more particularly to a cleaning tool for removing contamination including small particles in a critical area such as a wafer chuck and wafer support plate in a photolithographic stepper.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching, and planarization.

Photolithography, for example, a lithographic technique for optically transferring a pattern including semiconductor device circuit features onto a substrate is widely used in the fabrication of semiconductor devices. Generally, photolithography involves the performance of a sequence of process steps, including coating a semiconductor wafer with a photoresist layer, exposing the photoresist layer to an activating light source through a photomask, developing the photoresist layer, processing the semiconductor wafer according to the developed photoresist layer, and removing the photoresist layer. An optical photolithography stepper, including those available from ASM Lithography, Inc., located in Eindhoven, Netherlands, is typically used to expose the photoresist layer. An image of a portion of an integrated circuit (IC) is formed on a small, rectangular piece of glass referred to as a reticle, or photomask. The photomask is placed on the stepper and a reduced image formed therethrough is projected onto a portion of the photoresist layer covering the semiconductor wafer.

Where numerous semiconductor devices are to be fabricated from a single wafer, a mask may be used several times over portions of the semiconductor wafer surface. This is accomplished by using a stepper to index, or step the wafer supported on a wafer stage under an optical system including the mask and projection lens, in the wafer plane by a predetermined pitch. At each step, a portion of the wafer surface including the photoresist is exposed by the optical system, for example, with ultraviolet light, to form an image of the mask in the layer of photoresist. Once the wafer surface has been stepped to expose the photoresist, the wafer is then removed from the stepper and the image developed. Further processing steps follow to create features forming a portion integrated circuit, including repeating the photolithographic process in each layer of a multi-layer semiconductor device.

In operation, at each step, or "cell", the stepper performs a focusing operation, typically by altering the height of the wafer surface to achieve optimal focusing. To achieve optimal focusing over the entire surface of the wafer, the moveable stage, or chuck, on which the wafer rests and the wafer itself must be planar within the focal plane to a high degree of accuracy. For example, a particles smaller than 1 micron resting under the wafer surface between the stage and the wafer are enough to create a non-planer discontinuity or deformation in the wafer surface in the area where even one particle is. As a result, the area where the wafer is deformed will be out of focus causing loss of critical dimension in semiconductor device features. This effect is typically referred to as a "hotspot", a "chuck spot" or a "chuck ring". Such hot spots result in semiconductor devices with substandard features geometries, causing the entire wafer to be scrapped or the entire wafer reworked to correct the error.

In many cases, the particle that caused the defect adheres to the chuck itself, causing the defocusing error to be multiplied over several wafers until detected by visual or automated optical inspection. Consequently, both productivity and yield are detrimentally affected.

According to the prior art cleaning methods are generally used periodically to clean the wafer chuck. One problem with the prior art methods for cleaning, which generally involve manual methods for cleaning the wafer chuck, is that the cleaning process itself may contribute to particle contamination of the wafer chuck. For example, during the cleaning procedure, the wafer chuck including locating pins for slidably fitting into semiconductor wafer locating notches to hold the wafer in place are cleaned of contamination including loose particles. According to the prior art, the typical procedure is to use for example, a sponge to first wipe the wafer chuck manually with a solvent such as acetone prior to manually applying a cleaning abrasive, for example solid piece of $Al_2O_3$, to the surface to remove, for example, oxidation deposits and loosen adhering particles. During this manual process, the cleaning abrasive is typically hand held and abrading action applied to the wafer chuck surface. Frequently, during the manual cleaning process to remove contaminating particles, cleaning abrasive particles are dislodged from the cleaning abrasive causing additional contamination that must be removed in yet another cleaning step performed afterwards. Frequently, the is ineffective in removing all loose particles, including those that fall from the locating pins to the wafer chuck surface which are difficult to reach. As a result, the cleaning process has shortcomings including the additional cleaning step made necessary by use of the cleaning abrasive and the possibility that the manual cleaning process of the prior art will result in particle contamination of the wafer chuck surface from the cleaning process itself thereby leading to localized defocusing during the photolithographic exposure process.

There is therefore a need in the semiconductor processing art to develop an apparatus and method for more efficiently and effectively cleaning a wafer chuck used in a photolithographic exposure process thereby reducing particle contamination levels.

It is therefore an object of the invention to provide an apparatus and method for more efficiently and effectively cleaning a wafer chuck used in a photolithographic exposure process thereby reducing particle contamination levels while overcoming other shortcomings and deficiencies in the prior art.

SUMMARY OF THE INVENTION

To achieve the foregoing and other objects, and in accordance with the purposes of the present invention, as embodied and broadly described herein, the present invention provides a cleaning tool for simultaneously abrading a contaminated surface and collecting contaminating particles and a method for using the same.

In a first embodiment of the invention, a cleaning tool is provided including an abrasive surface said abrasive surface including a recessed area forming a collection space; said collection space in gaseous communication with at least one gaseous pathway; said at least one gaseous pathway passing longitudinally through a rotatably adjustable elongated handle rotatably attached to the abrasive member for adjustably varying an orientation angle defined by the elongated handle and the abrasive surface; whereby a suction force may be applied along the at least one gaseous pathway to collect particles loosened by the abrasive surface through the collection space.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

It will be appreciated that the method and apparatus is explained by reference to a cleaning process using an $Al_2O_3$ abrasive applied to a wafer chuck used in a photolithographic stepping process, however the cleaning tool according to the present invention may be supplied with different types of abrasives and used in any cleaning process where it would be advantageous to use a cleaning abrasive to clean the target area while simultaneously removing additional contamination caused by the cleaning abrasive.

Figure 1A:
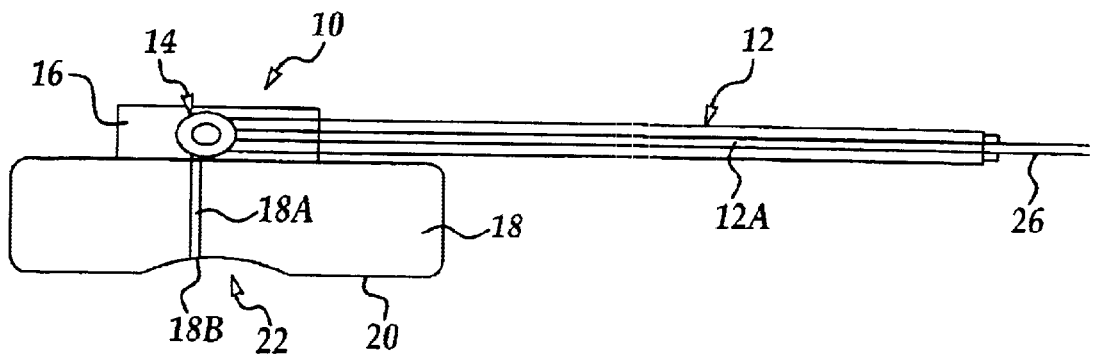
FIG. 1A is a cross sectional side view representation of the cleaning tool according to an exemplary embodiment of the present invention.

Referring to FIG. 1A, the cleaning tool 10 of the present invention includes an elongated handle 12, having a rotatable means 14 on a first end of elongated handle 12 that rotatably connects the elongated handle 12 to an adjustable clamping means 16. The adjustable clamping means 16 in turn is fixed to an abrasive means 18 having an abrasive means surface 20 such that both the adjustable clamping means 16 and the abrasive means 18 are rotatable around a rotating axis included in rotating means 14 the rotating axis being substantially parallel to the abrasive means surface 20 and substantially perpendicular to an axial direction of the elongated handle 12. The adjustable clamping means 16 includes means for adjustably fixing an orientation angle the elongated handle 12 makes with the abrasive means surface 20 upon rotating the elongated handle 12 about the rotating axis included in rotating means 14. Elongated handle 12 is supplied with a first gaseous pathway 12A, for example, along the axial dimension of the elongated handle 12, gaseously communicating through rotatable means 14 with a second gaseous pathway 18A disposed through a central portion of abrasive means 18 to penetrate abrasive means surface 20 to form a suction opening 18B.

In one embodiment, the abrasive means surface 20 includes a space, for example a concave surface having a radius surrounding the suction opening 18B to form a collection space 22. It will be appreciated that the collection space 22 may be of any suitable geometry allowing a vacuum suction force to be applied over a surface area for collecting small particles, for example, the collection space 22 may be cone shaped with the suction opening 18B at the apex. Further, the edges of the collection space 22 at abrasive means surface 20 are preferably rounded to avoid sharp edged features that are potentially damaging to a target cleaning surface.

In another embodiment, when the cleaning tool is intended for use as a wafer chuck cleaning tool, the abrasive means 18 for example, preferably includes polycrystalline $Al_2O_3$ at least one a cleaning surface, for example abrasive means surface 20 with a purity of, for example, greater than about 99.7 percent. Further, the abrasive means 18 is preferably a cylindrical shape having at least the contacting surface (abrasive means surface 20) smoothed along the peripheral edges to form a curvature radius to prevent damage from sharp edged surface features.

Figure 1B:
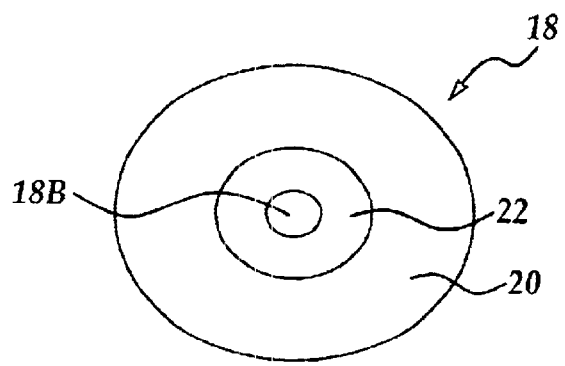
FIG. 1B is a top view representation of the cleaning tool abrasive surface according to an exemplary embodiment of the present invention.

Referring to FIG. 1B showing a top view of the abrasive means 18, the abrasive means surface 20 may range, for example, from about 3 to about 5 cm in diameter, more preferably about 4 cm in diameter, with the diameter of the suction opening 18B for providing a vacuum suction force to the abrasive means surface through collection space 22 ranging from about 0.5 cm in diameter to about 1.5 cm in diameter, more preferably about 1 cm in diameter. Further, the collection space 22 formed in abrasive means surface 20 surrounding the suction opening 18B, is preferably centrally disposed around suction opening 18B forming for example, a concave depression that may, for example, range from about 1 cm in diameter to about 2 cm in diameter, with for example, a depth measured from the planar portion of abrasive means surface 20 of about 0.25 cm to about 0.5 cm. It will be appreciated that the size and depth of collection space 22 may vary depending on the cleaning operation to be performed and the suction force of the vacuum applied. For example, the collection space area may be increased thereby spreading the vacuum suction force over a larger area while correspondingly increasing a vacuum suction force supplied by a vacuum source. The collection space 22 together with the vacuum suction force is preferably sized to collect for example, $Al_2O_3$ particles having nominal diameters of at least less than about 10 microns resting on a surface.

Figure 1C:
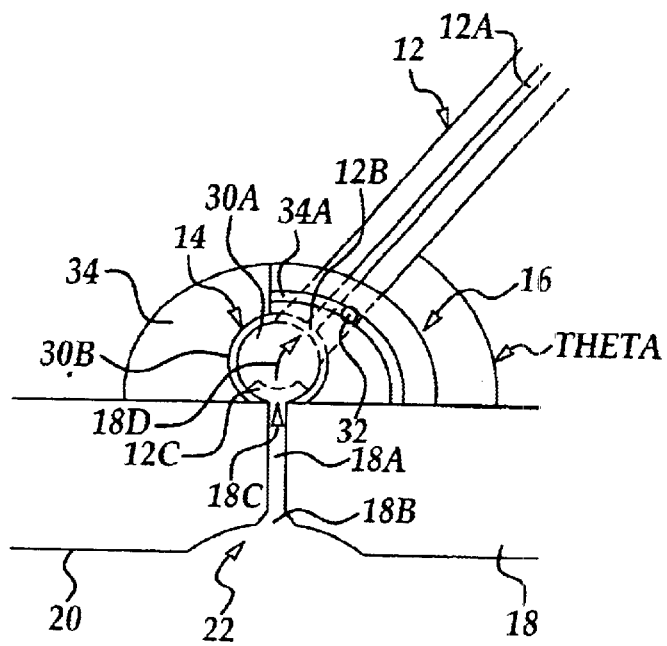
FIG. 1C is a cross sectional side view representation of the cleaning tool according to an exemplary embodiment of the present invention.

Referring to FIG. 1C is an expanded view showing an exemplary embodiment of the rotatable means 14 including adjustable clamping means 16, for rotating the abrasive means 18 about a rotating axis substantially perpendicular to the elongated handle 12. The rotatable means preferably allows rotation such that an orientation angle theta formed between the abrasive means surface 20 and the elongated handle may be varied from about 0 degrees to at least about 90 degrees. The rotatable means 14, for example is a hollow cylinder (bearing) 30A closed at both ends and fixed to the elongated handle 12 such that the axis of the hollow cylinder 30A is perpendicular to the elongated handle 12 axis disposed along the first gaseous pathway 12A communicating with a first opening 12B through the hollow cylinder 30A which in turn communicates with second gaseous pathway 18A as further explained below. The hollow cylinder (bearing), for example may be disposed in a bearing seat 30B housed in a clamping means 16. The clamping means 16 may be any conventional means for fixing the rotation of the hollow cylinder (bearing) 30A in the bearing seat 30B to fix an orientation angle theta formed between the elongated handle 12 and the abrasive means surface 20, including for example, a set screw 32 disposed through a bearing housing 34 along a radial rotation path 34A for tightening the elongated handle 12. It will be appreciated that the bearing 30A and bearing seat 30B may also form, for example, a ball and socket configuration. The second gaseous pathway 18A forms gaseous communication with the first gaseous pathway 12A through the rotatable means 14, for example, by a second opening 18C extending through the bearing seat to communicate with a slot 12C formed along the radial rotation path of the hollow cylinder (bearing) 30A to form continuous gaseous communication with the hollow cylinder (bearing) and first gaseous pathway 12A during rotation. For example, the slot 12C may be formed in about a half circle through the hollow cylinder (bearing) 30A along a radial rotation pathway, that portion of the slot adjacent the bearing seat forming a closed communication with the bearing seat excepting that portion overlying the second opening 18C in bearing seat to form open communication with second gaseous pathway 18A and first gaseous pathway 12A as indicated by gaseous flow directional arrow 18D.

The elongated handle 12, the rotatable means 14, and clamping means 16 may be formed of, for example, stainless steel. Referring again to FIG. 1A, the distal end of the elongated handle 12 may include a vacuum tight fitting for attaching a flexible hose 26 connected to a vacuum source (not shown) for supplying a vacuum suction force through the elongated handle 12 to the collectible space 22. It will be appreciated that the flexible hose 26 may alternatively extend into gaseous pathway 12A and be housed thereby.

In operation, for example, elongated handle 12 is adjusted to an advantageous orientation angle theta for performing a cleaning operation. A vacuum source is supplied to flexible hose 26 to supply a vacuum suction force through first gaseous pathway 12A, rotatable means 14 and second gaseous pathway 18A to create a suction force extending through suction opening 18B and applied to collection space 22. The cleaning tool is then applied to the target cleaning surface, for example a wafer chuck including locating pins. In exemplary operation, the cleaning tool 10 with abrasive means surface 20, for example polycrystalline $Al_2O_3$, including collection space 22 is carefully applied to the wafer chuck including the locating pins to lightly abrade the contaminated surface. As contaminating particles are dislodged by the abrading action from the wafer chuck including the tips of locating pins the vacuum suction force created in collection area 22 collects the contaminating particles, the contaminating particles including an occasional dislodged particle from the $Al_2O_3$ surface. The contaminating particles are collected from the target surface and transported through suction opening 18B along second gaseous pathway 18A through rotatable means 14 and gaseous pathway 12A to a vacuum source where they may be collected by a filtering means.

According to the cleaning tool of the present invention, an apparatus and method for cleaning, for example, a wafer chuck included in a photolithographic stepping apparatus has been presented thereby providing a cleaning tool and procedure with greater efficiency and effectiveness compared to the prior art. As a result, the shortcomings of the prior art leading to loose particle contamination causing localized defocusing and a consequent reduction in semiconductor wafer yield are minimized while providing decreased preventative maintenance downtime and increased semiconductor wafer yields.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A cleaning tool for simultaneously abrading a contaminated surface and collecting contaminating particles comprising:
    an abrasive member comprising an abrasive surface said abrasive surface including a recessed area forming a collection space;
    said collection space in gaseous communication with at least one gaseous pathway;
    said at least one gaseous pathway passing longitudinally through a rotatably adjustable elongated handle rotatably attached to the abrasive member for adjustably varying an orientation angle defined by the elongated handle and the abrasive surface;
    whereby a suction force may be applied along the at least one gaseous pathway to collect particles loosened by the abrasive surface through the collection space.

2. The cleaning tool of claim 1, wherein the elongated handle is rotatably attached to the abrasive member by a rotatable bearing member.

3. The cleaning tool of claim 2, wherein the rotatable bearing member comprises a ball and socket configuration.

4. The cleaning tool of claim 2, wherein the at least one gaseous pathway comprises a first gaseous pathway extending from the collection space through an abrasive means and gaseously communicates through the rotatable bearing with a second gaseous pathway extending along an axis of the elongated handle.

5. The cleaning tool of claim 4, wherein the rotatable bearing member includes a bearing and bearing seat for rotating the rotatable member including gaseous communication openings formed to maintain open communication between the first gaseous pathway and the second gaseous pathway while substantially maintaining a vacuum suction.

6. The cleaning tool of claim 1, wherein the abrasive surface comprises $Al_2O_3$.

7. The cleaning tool of claim 1, wherein the elongated handle is fixably adjustable in relation to the abrasive member surface to fix the orientation angle.

8. The cleaning tool of claim 1, wherein the abrasive surface has a diameter of from about 3 cm to about 5 cm.

9. The cleaning tool of claim 1, wherein the at least one gaseous pathway has a diameter ranging from about 0.5 cm to about 1.5 cm in diameter.

10. The cleaning tool of claim 1, wherein the orientation angle is variable between about 0 degrees and at least about 90 degrees.

11. A cleaning method for cleaning a wafer chuck while simultaneously removing particle contamination comprising the steps of:
    providing an abrasive member comprising an abrasive surface said abrasive surface including a recessed area forming a collection space;
    said collection space in gaseous communication with at least one gaseous pathway;
    said at least one gaseous pathway passing longitudinally through a rotatably adjustable elongated handle rotatably attached to the abrasive member for adjustably varying an orientation angle defined by the elongated handle and the abrasive surface;
    rotating the elongated handle to form the orientation angle with respect to the abrasive surface;

supplying a vacuum suction force to the abrasive member including the collection space; and, abrading a water chuck with the abrasive surface to remove contamination while simultaneously positioning the collection space to collect loose particles from the wafer chuck.

12. The cleaning method of claim 11, wherein the collection space and applied vacuum suction force is capable of removing a loose particle of at least about 10 microns in nominal diameter resting on a contaminated surface when the collection space is positioned over the contaminated surface to make contact with the abrasive surface.

13. The cleaning method of claim 11, wherein the abrasive surface comprises $Al_2O_3$.

14. The cleaning method of claim 11, wherein the elongated handle is fixably adjusted in relation to the abrasive member surface to fix the orientation angle.

15. The cleaning method of claim 11, wherein the abrasive surface has a diameter of from about 3 cm to about 5 cm.

16. The cleaning method of claim 11, wherein the at least one gaseous pathway has a diameter ranging from about 0.5 cm to about 1.5 cm in diameter.

* * * * *